United States Patent
Kinjo

(10) Patent No.: US 12,135,250 B2
(45) Date of Patent: Nov. 5, 2024

(54) PIEZOELECTRIC SENSOR AND MANUFACTURING METHOD OF PIEZOELECTRIC SENSOR

(71) Applicant: Japan Display Inc., Tokyo (JP)

(72) Inventor: Hiroumi Kinjo, Tokyo (JP)

(73) Assignee: Japan Display Inc., Tokyo (JP)

( * ) Notice: Subject to any disclaimer, the term of this patent is extended or adjusted under 35 U.S.C. 154(b) by 317 days.

(21) Appl. No.: 17/690,301

(22) Filed: Mar. 9, 2022

(65) Prior Publication Data

US 2022/0196489 A1  Jun. 23, 2022

Related U.S. Application Data

(63) Continuation of application No. PCT/JP2020/028309, filed on Jul. 21, 2020.

(30) Foreign Application Priority Data

Sep. 13, 2019  (JP) .................................. 2019-167727

(51) Int. Cl.
| | |
|---|---|
| *G01L 1/16* | (2006.01) |
| *H10N 30/00* | (2023.01) |
| *H10N 30/06* | (2023.01) |
| *H10N 30/079* | (2023.01) |
| *H10N 30/098* | (2023.01) |
| *H10N 30/30* | (2023.01) |

(Continued)

(52) U.S. Cl.
CPC .............. *G01L 1/16* (2013.01); *H10N 30/06* (2023.02); *H10N 30/079* (2023.02); *H10N 30/098* (2023.02); *H10N 30/302* (2023.02); *H10N 30/708* (2024.05); *H10N 30/857* (2023.02); *H10N 30/87* (2023.02)

(58) Field of Classification Search
CPC ........ G01L 1/16; H10N 30/06; H10N 30/079; H10N 30/098; H10N 30/10516; H10N 30/302; H10N 30/857; H10N 30/87
See application file for complete search history.

(56) References Cited

U.S. PATENT DOCUMENTS

| | | | | |
|---|---|---|---|---|
| 8,082,641 | B2 * | 12/2011 | Lin .......................... | B41J 2/161 |
| | | | | 29/841 |
| 10,605,678 | B2 | 3/2020 | Kihara et al. | |

(Continued)

FOREIGN PATENT DOCUMENTS

| | | | | |
|---|---|---|---|---|
| JP | 2000346717 | A | * | 12/2000 |
| JP | 2002169164 | A | * | 6/2002 |

(Continued)

OTHER PUBLICATIONS

JP-2000346717-A English Translation (Year: 2000).*

(Continued)

*Primary Examiner* — Ryan D Walsh
(74) *Attorney, Agent, or Firm* — K&L Gates LLP

(57) ABSTRACT

A piezoelectric sensor, comprising: a stress applying layer in which a plurality of stress applying grooves extending in parallel with a first direction are formed in a predetermined region on a whole surface; and a piezoelectric layer that is layered on the stress applying layer and formed from a polymer piezoelectric material containing an optical active polymer.

8 Claims, 11 Drawing Sheets

(51) Int. Cl.
*H10N 30/857* (2023.01)
*H10N 30/87* (2023.01)

(56) References Cited

U.S. PATENT DOCUMENTS

| | | | |
|---|---|---|---|
| 2016/0153845 A1* | 6/2016 | Kawamura | G01L 1/16 |
| | | | 29/25.35 |
| 2017/0179370 A1 | 6/2017 | Kim et al. | |
| 2017/0250336 A1 | 8/2017 | Tanimoto et al. | |
| 2021/0338111 A1* | 11/2021 | Onishi | G08B 21/0461 |

FOREIGN PATENT DOCUMENTS

| | | | | |
|---|---|---|---|---|
| JP | 2015118032 A | * | 6/2015 | |
| JP | 2015186910 A | | 10/2015 | |
| JP | 2017120850 A | | 7/2017 | |
| JP | 2018207092 A | | 12/2018 | |
| WO | 2016002604 A1 | | 1/2016 | |
| WO | 2016194690 A1 | | 12/2016 | |

OTHER PUBLICATIONS

JP-2015118032-A (Year: 2015).*
JP-2002169164-A English Translation (Year: 2002).*
Search Report issued in International Patent Application No. PCT/JP2020/028309 on Aug. 25, 2020.

* cited by examiner

PIEZOELECTRIC SENSOR AND MANUFACTURING METHOD OF PIEZOELECTRIC SENSOR

CROSS-REFERENCE TO RELATED APPLICATION

This application is a continuation of International Patent Application No. PCT/JP2020/028309 filed on Jul. 21, 2020 which designates the United States, incorporated herein by reference, and which claims the benefit of priority from Japanese Patent Application No. 2019-167727 filed on Sep. 13, 2019, incorporated herein by reference.

BACKGROUND

1. Technical Field

The present disclosure relates to a piezoelectric sensor and a manufacturing method of the piezoelectric sensor.

2. Description of the Related Art

Polymer piezoelectric materials such as polyvinyl fluoride, and polyvinylidene difluoride have been known as piezoelectric materials. Those polymer piezoelectric materials exhibit piezoelectricity by being subjected to stretching processing that stretches their polymer chains and polling after the stretching processing. Recently, optical active polymers having optical activity such as polylactic acid and polypeptide are used as the piezoelectric materials. Those optical active polymers exhibit piezoelectricity by being subjected to uniaxial stretching processing. International Publication WO 2016/194690 A1 discloses a piezoelectric sensor including a piezoelectric sheet manufactured by an optical active polymer.

The piezoelectric sheet in WO 2016/194690 A1 is attached to a substrate with an adhesive. Work for attaching the piezoelectric sheet is thus required, thereby causing manufacturing processes of the piezoelectric sensor to become complicated. With a conventional technique, it is difficult to subject a large-area sheet formed from the optical active polymer to the stretching processing.

An object of the disclosure is to provide a piezoelectric sensor that can increase an area of a piezoelectric layer (piezoelectric sheet) and needs no attaching work of the piezoelectric layer (piezoelectric sheet), and a manufacturing method of the piezoelectric sensor.

SUMMARY

A piezoelectric sensor according to an embodiment of the present disclosure includes a stress applying layer in which a plurality of stress applying grooves extending in parallel with a first direction are formed in a predetermined region on a whole surface, and a piezoelectric layer that is layered on the stress applying layer and formed from a polymer piezoelectric material containing an optical active polymer.

DETAILED DESCRIPTION

The following describes embodiments of a piezoelectric sensor in the present disclosure in detail with reference to the accompanying drawings. The contents described in the following embodiments do not limit the disclosure of the present disclosure. The constituent elements described below include elements easily conceivable by those skilled in the art and substantially identical elements. The constituent elements described below can be combined as appropriate. What is disclosed herein is made by way of examples. All appropriate modifications that may be easily achieved by those skilled in the art within the spirit of the disclosure are naturally included in the scope of the present disclosure. To further clarify the description, the drawings schematically illustrate, for example, the widths, thicknesses, and shapes of respective components as compared with actual aspects thereof. Those are illustrated by way of examples and do not limit the interpretation of the present disclosure. In the specification and the drawings, the same elements already described in the previous drawings are labeled with the same symbols and detailed description thereof may be omitted as appropriate.

First Embodiment

Figure 1:
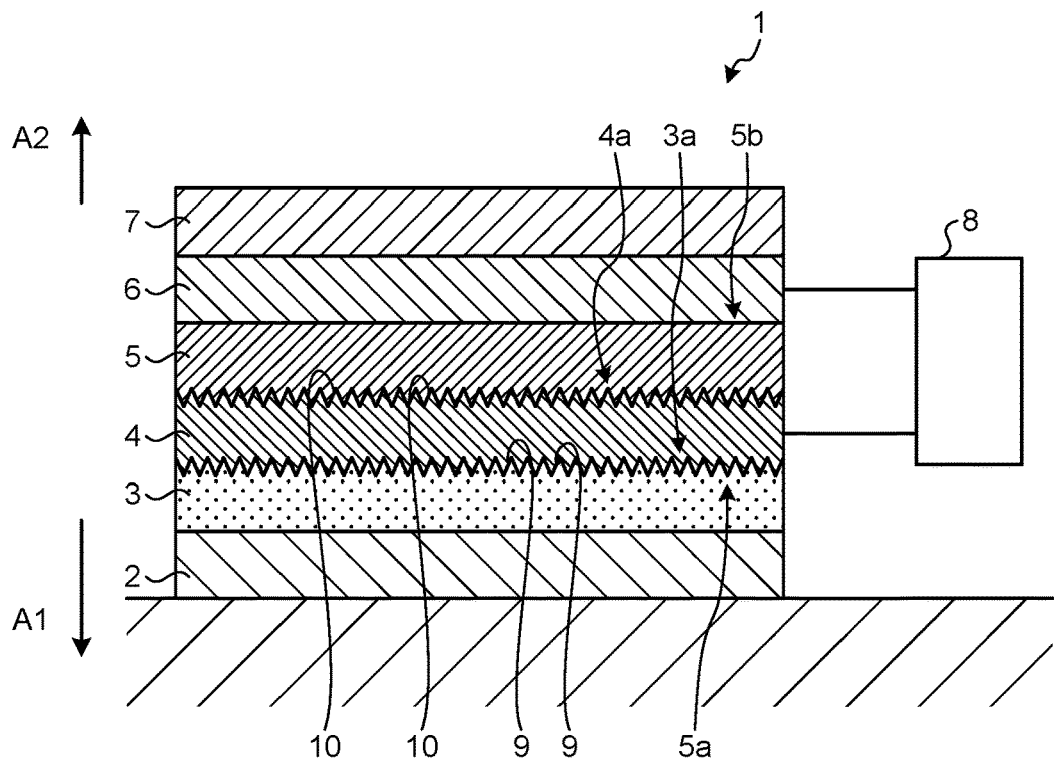
FIG. 1 is a cross-sectional view illustrating a cross-sectional structure of a piezoelectric sensor according to a first embodiment.
Figure 2:
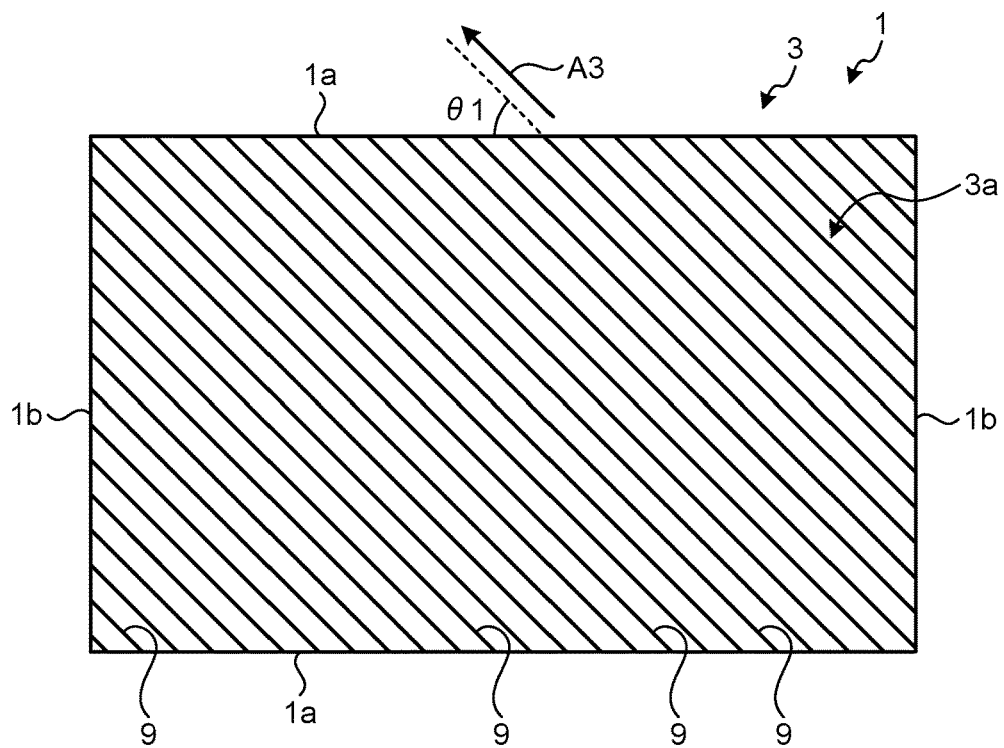
FIG. 2 is a plan view in which only a template layer of the piezoelectric sensor according to the first embodiment is extracted and a second surface of the template layer is viewed from a piezoelectric layer side.

FIG. 1 is a cross-sectional view illustrating a cross-sectional structure of a piezoelectric sensor according to a first embodiment. FIG. 2 is a plan view in which only a template layer of the piezoelectric sensor according to the first embodiment is extracted and a second surface of the template layer is viewed from a piezoelectric layer side. This piezoelectric sensor 1 according to the first embodiment includes a substrate 2, a template layer 3, a first electrode layer 4, a piezoelectric layer 5, a second electrode layer 6, and a protection layer 7. The piezoelectric sensor 1 is a layered structure composed of the substrate 2, the template layer 3, the first electrode layer 4, the piezoelectric layer 5, the second electrode layer 6, and the protection layer 7 that are layered in this order. The direction in which the substrate 2, the template layer 3, the first electrode layer 4, the piezoelectric layer 5, the second electrode layer 6, and the protection layer 7 are layered is described as a layering direction for convenience of explanation. The direction in which the substrate 2 is disposed when viewed from the piezoelectric layer 5 is described as a first layering direction A1. The direction in which the protection layer 7 is disposed when viewed from the piezoelectric layer 5 is described as a second layering direction A2.

A controller 8 is coupled to the first electrode layer 4 and the second electrode layer 6 of the piezoelectric sensor 1 for measuring force applied to the piezoelectric sensor 1. The piezoelectric sensor 1 is formed in a rectangular shape when viewed from the layering direction (refer to FIG. 2). The piezoelectric sensor 1 thus has a pair of long sides 1a and a pair of short side 1b.

As illustrated in FIG. 1, the substrate 2 and the protection layer 7 are formed from a resin having flexibility. The template layer 3 is a layer formed from a resin such as polyimide, and is formed from a material that easily forms grooves. The template layer 3 is disposed opposite the piezoelectric layer 5 in relation to the first electrode layer (stress applying layer) 4. The template layer 3 has a second surface 3a in the second layering direction A2. The second surface 3a of the template layer 3 faces the first electrode layer 4. The second surface 3a of the template layer 3 has primary grooves 9 that are formed thereon and recessed in the first layering direction A1. As illustrated in FIG. 2, the primary grooves 9 are formed in a given region on the second surface (surface) 3a of the template layer 3. In the present embodiment, the primary grooves 9 are formed on the whole surface of the second surface 3a of the template layer 3. The primary grooves 9 extend in a straight line shape. The primary grooves 9 are formed by rubbing processing, which is described later. The primary grooves 9 are disposed at equal intervals and in parallel with a first direction A3. In other words, the primary grooves 9 extend such that an angle θ1 made with respect to the long sides 1a and 1a of the piezoelectric sensor 1 is 45 degrees. That is, the primary grooves 9 are inclined at an angle of 45 degrees with respect to each of the long side 1a and 1a and the short side 1b and 1b of the piezoelectric sensor 1. A width of the primary groove 9 is described in a manufacturing method.

As illustrated in FIG. 1, the first electrode layer 4 and the second electrode layer 6 are transparent electrodes formed from indium tin oxide (ITO) or indium zinc oxide (IZO), or metal electrodes made from copper (Cu), for example. The first electrode layer 4 is the stress applying layer that applies stress so that an optical active polymer extends in a uniaxial direction, and is layered on the second surface 3a of the template layer 3. The first electrode layer 4 is formed to have a uniformed thickness in the layering direction and in a shape along the second surface 3a of the template layer 3. Therefore, a plurality of secondary grooves 10 recessed in the first layering direction A1 are formed on a portion that is on a second surface 4a of the first electrode layer 4 and overlaps with the primary grooves 9 in the layering direction. In the predetermined region on which the secondary grooves 10 are formed on the surface of the second surface 4a of the first electrode layer 4, the secondary grooves 10 are also formed on the whole surface of the second surface 4a of the first electrode layer 4 because the primary grooves 9 are formed on the whole surface of the second surface 3a of the template layer 3.

The piezoelectric layer 5 is a layer layered on the first electrode layer (stress applying layer) 4 and formed from the polymer piezoelectric material containing the optical active polymer. The optical active polymer is a helical chiral polymer having the optical activity. Examples of the optical active polymer include cellulose derivatives, polyether, polypeptide, and polyester. Examples of the cellulose derivatives include triacetyl cellulose, diacetyl cellulose, ethyl cellulose, nitro cellulose, cyano ethyl cellulose, and cyanoethylated hydrocellulose (CEHC). An example of the polyether is poly-D-propylene oxide (PPO). Examples of the polypeptide include poly (γ-methyl-L-glutamate) (PMLG), poly (γ-benzyl-L-glutamate) (PBLG), polyleucine (Pleu), and poly (leucine-co-γ-benzyl-L-glutamate). Examples of the polyester include poly-3-hydroxybutyrate and polylactic acid (PLA).

The piezoelectric layer 5 is in contact with the layer on which the secondary grooves 10 are formed. That is, the piezoelectric layer 5 is formed on the second surface 4a of the first electrode layer 4 and the optical active polymer contained in the polymer piezoelectric material extends along the secondary grooves 10. Therefore, the piezoelectric layer 5 has a crystalized portion in which the optical active polymer is disposed with regularity and exhibits piezoelectricity. From those described above, in the first embodiment, the secondary grooves 10 are stress applying grooves.

The piezoelectric layer 5 is not polarized when being bent along an extending direction of the optical active polymer or along a direction perpendicular to the extending direction of the optical active polymer. In contrast, the piezoelectric layer 5 is polarized when being bent along inclined lines inclined at an angle of 45 degrees with respect to the extending direction of the optical active polymer. Specifically, the extending direction of the optical active polymer is the same direction as that of the primary grooves 9, and makes an angle of 45 degrees with respect to the long side 1a of the piezoelectric sensor 1. Therefore, in the present embodiment, the piezoelectric layer 5 is polarized when the piezoelectric sensor 1 is bent in such a U-shape that the long sides 1a and 1a or the short sides 1b and 1b of the piezoelectric sensor 1 approach each other. In contrast, the piezoelectric layer 5 is not polarized when the piezoelectric sensor 1 is bent in such a U-shape that the opposing corners of the piezoelectric sensor 1 approach each other. From those described above, the piezoelectric sensor 1 including the piezoelectric layer 5 is a bending sensor that detects bending. The piezoelectric layer 5 is polarized when the piezoelectric layer 5 is bent as described above, and capacitance held between the first electrode layer 4 and the second electrode layer 6 increases.

The controller 8 detects the capacitance between the first electrode layer 4 and the second electrode layer 6 to determine presence or absence of bending of the piezoelectric layer 5. Specifically, the controller 8 applies a reference voltage as a reference to the first electrode layer 4 and detects a voltage value from the second electrode layer 6, thereby detecting the capacitance between the first electrode layer 4 and the second electrode layer 6. The increase in capacitance due to the bending of the piezoelectric layer 5 causes the voltage value detected from the second electrode layer 6 becomes large, and thereby the bending of the piezoelectric layer 5 can be detected.

Figure 3:
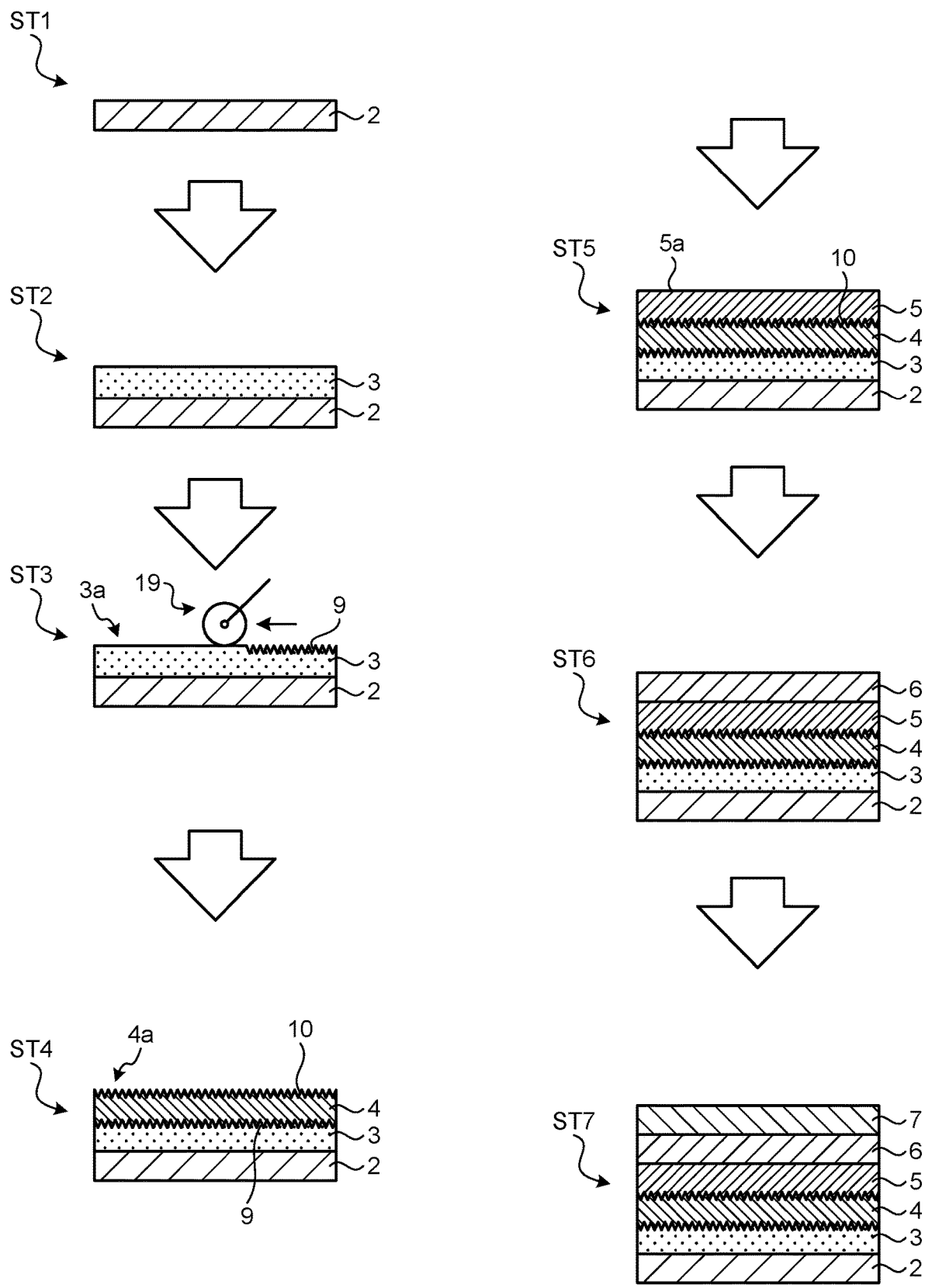
FIG. 3 is an explanatory view for explaining an example of a manufacturing method of the piezoelectric sensor according to the first embodiment.

FIG. 3 is an explanatory view for explaining an example of a manufacturing method of the piezoelectric sensor according to the first embodiment. The following describes a production method of the piezoelectric sensor 1.

The manufacturing method of the piezoelectric sensor 1 includes a preparation process that prepares the substrate 2 (ST1), a template layer forming process that forms the template layer 3 on the substrate 2 (ST2), a primary groove forming process that forms the primary grooves 9 (ST3), a secondary groove forming process that forms the first electrode layer 4 on the template layer 3 (ST4), a piezoelectric layer forming process that forms the piezoelectric layer 5 on the first electrode layer 4 (ST5), a second electrode layer forming process that forms the second electrode layer 6 on the piezoelectric layer 5 (ST6), and a protection layer forming process that forms the protection layer 7 (ST7).

The preparation process (ST1) is a process to prepare the substrate 2 formed in a predetermined shape. The substrate 2 may be formed by the same manufacturing method as the template layer forming process (ST2) or may be a preliminarily manufactured one prepared. The template layer forming process (ST2) is a process to form the template layer 3 on the substrate 2 by a solution method or a vapor deposition method. The substrate 2 and the template layer 3 have a flat plate like shape, and the second surface 3a of the template layer 3 is a flat surface.

The primary groove forming process (ST3) in the first embodiment forms the primary grooves 9 by rotating a roller 19 on which a cloth such as nylon is winded while the roller 19 is thrusted into the template layer 3 with a predetermined pressure. The width and depth of each primary groove 9 are formed such an extent that the secondary grooves 10 formed corresponding to the primary grooves 9 can apply stress causing the optical active polymer to extend.

The secondary groove forming process (ST4) is a process to form the secondary grooves 10 on the second surface 4a of the first electrode layer 4 while the first electrode layer 4 is formed on the second surface 3a of the template layer 3 by the vapor deposition method. At the secondary groove forming process (ST4), the width and depth of each secondary groove 10 need to be adjusted such that the secondary grooves 10 recessed in the second surface 4a of the first electrode layer 4 corresponding to the primary grooves 9 function as the stress applying grooves causing the optical active polymer to extend.

The piezoelectric layer forming process (ST5) is a process to form the piezoelectric layer 5 on the second surface 4a of the first electrode layer 4 by the solution method, the vapor deposition method, or polymerization. A concrete example of the solution method includes a method of applying a solution of the polymer piezoelectric material by spin coating or ink jetting and thereafter drying the applied polymer piezoelectric material. A concrete example of a physical vapor deposition (PVD) method in the vapor deposition method include a sputtering method or the like. Examples of a chemical vapor deposition (CVD) method include a mist CVD method, a laser CVD method, and the like. The optical active polymer in the secondary grooves 10 serving as the stress applying grooves extend along the groove direction to exhibit piezoelectricity. The second surface 5a of the piezoelectric layer 5 is a flat surface.

The second electrode layer forming process (ST6) and the protection layer forming process (ST7) are processes to form the second electrode layer 6 and the protection layer 7, and examples thereof include the solution method or the vapor deposition method. However, it is not limited in the present disclosure.

As described above, the piezoelectric sensor 1 in the first embodiment includes, as an underlayer of the piezoelectric layer 5, the first electrode layer (stress applying layer) 4 having the stress applying grooves (secondary grooves 10), and causes the optical active polymer to extend to exhibit power generation property. The piezoelectric layer 5 having a large area can be thus easily manufactured. The work for attaching the piezoelectric layer (piezoelectric sheet) 5 is not required, thereby increasing production efficiency of the piezoelectric sensor 1.

The following describes modifications of the first embodiment and other embodiments. The same constituent elements as described in the embodiment above are labeled with the same numerals and duplicated descriptions thereof are omitted.

First Modification

Figure 4:
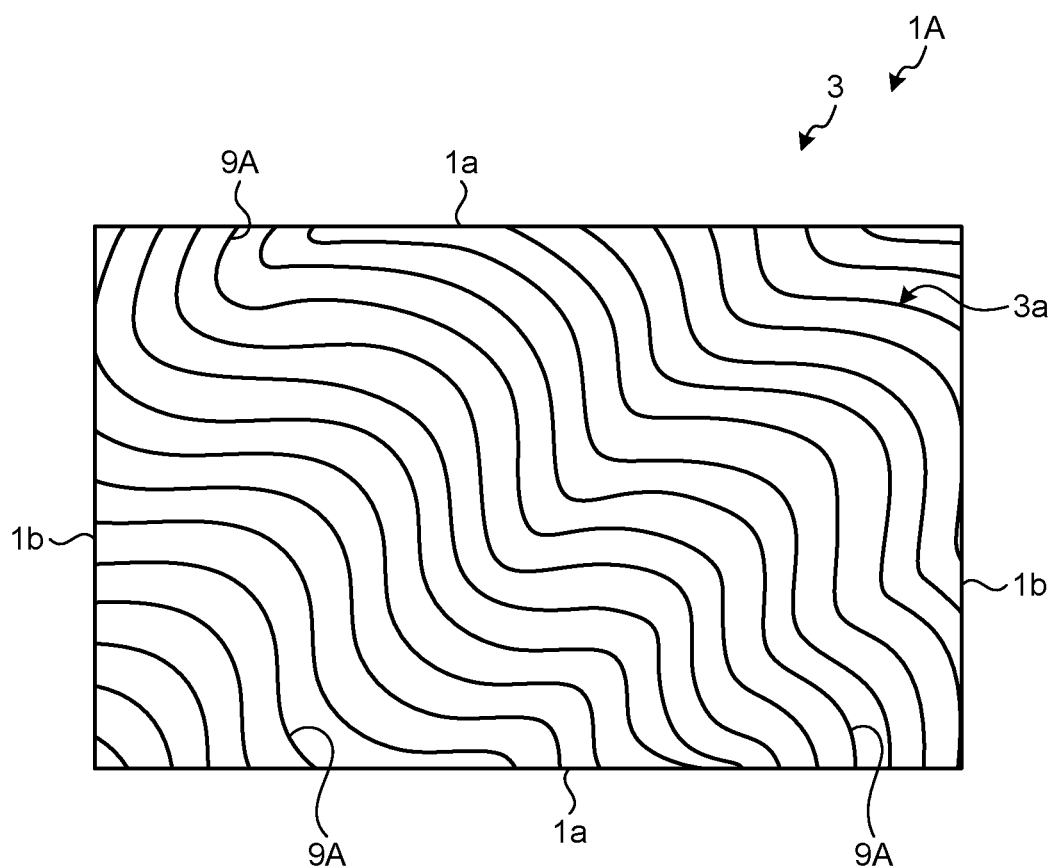
FIG. 4 is a plan view in which only the template layer of a piezoelectric sensor according to a first modification is extracted and the second surface of the template layer is viewed from the piezoelectric layer side.

FIG. 4 is a plan view in which only the template layer of a piezoelectric sensor according to a first modification is extracted and the second surface of the template layer is viewed from a second direction. A piezoelectric sensor 1A in the first modification differs from the piezoelectric sensor 1 in the first embodiment in that primary grooves 9A formed on the second surface 3a of the template layer 3 have a curved shape. The primary grooves 9A have a waveform shape in plan view. This results in the secondary grooves (stress applying grooves) 10 formed on the first electrode layer 4 having a waveform shape. The angle θ1 (refer to FIG. 2) made by the extending direction of the optical active polymer and the long sides 1a and 1a of the piezoelectric sensor 1 also includes other angles than 45 degrees. As a result, the piezoelectric layer 5 is also polarized when the piezoelectric sensor 1 is bent in other cases than when the piezoelectric sensor 1 is bent such that the long sides 1a and 1a or the short sides 1b and 1b of the piezoelectric sensor 1 approach each other. As described above, according to the first modification, a range that can detect the bending of the piezoelectric sensor 1 increases.

Second Modification

Figure 5:
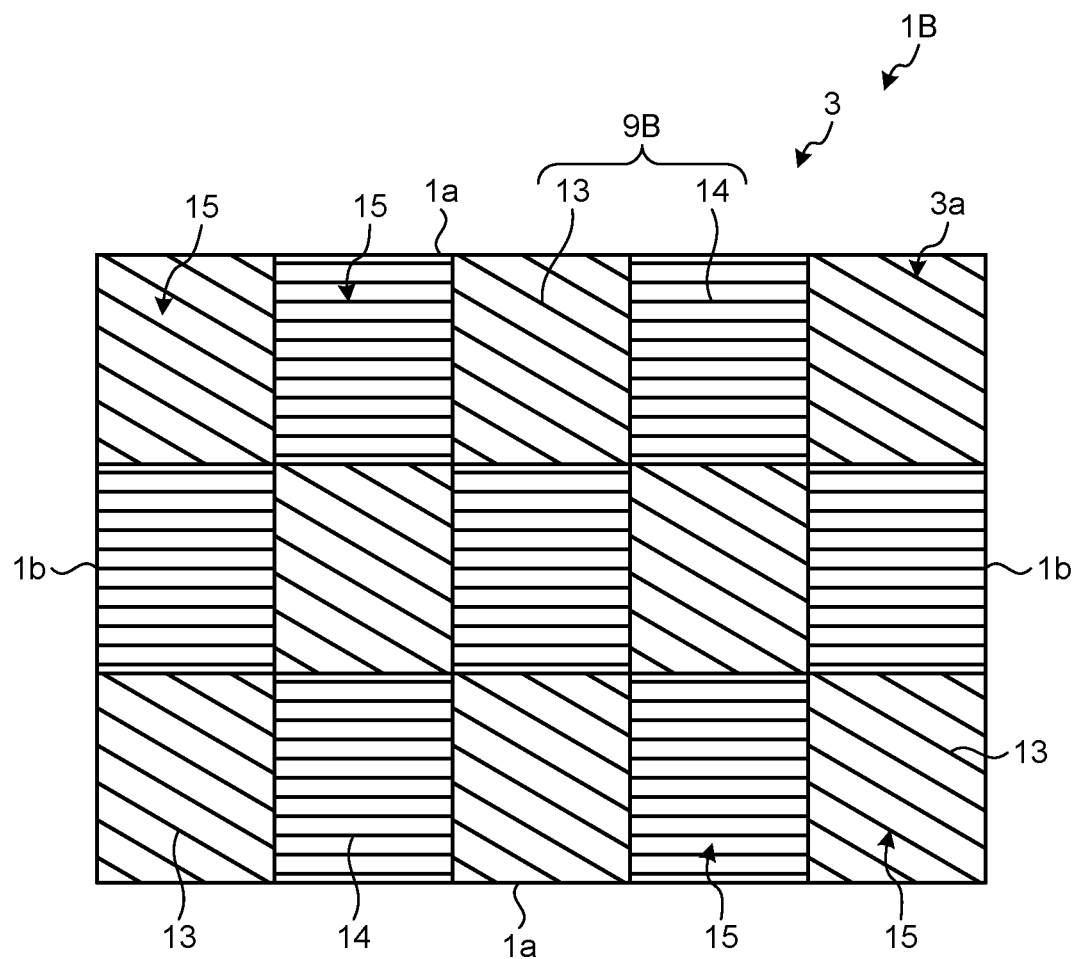
FIG. 5 is a circuit diagram illustrating an arrangement of a display unit according to the present embodiment.

FIG. 5 is a plan view in which only a template layer of a piezoelectric sensor according to a second modification is extracted and the second surface of the template layer is viewed from the piezoelectric layer. This piezoelectric sensor 1B in the second modification differs from the piezoelectric sensor 1 in the first embodiment in that grooves formed on the second surface 3a of the template layer 3 are primary grooves 9B. The primary grooves 9B have inclined grooves 13 and parallel grooves 14. The inclined grooves 13 are a plurality of stress applying grooves extending in parallel with the first direction. The parallel grooves 14 are a plurality of stress applying grooves extending in parallel with the direction different from the first direction. Specifically, the angle θ1 (refer to FIG. 2) made by the long sides 1a and 1a of the piezoelectric sensor 1 and the inclined groove 13 is 45 degrees. The angle θ1 (refer to FIG. 2) made by the long sides 1a and 1a of the piezoelectric sensor 1 and the parallel groove 14 is 0 degrees. The parallel grooves 14 are in parallel with the long sides 1a and 1a. The secondary grooves (stress applying grooves) 10, thus, have two types of grooves having extending directions different by 45 degrees. The second surface 3a of the template layer 3 is divided into a matrix having a row-column configuration, and has a plurality of regions 15 each formed in a rectangular shape in plan view. In each of the divided regions 15, the inclined grooves 13 or the parallel grooves 14 are formed.

As described above, the stress applying layer of the second modification has the regions 15. The regions 15 includes first regions 15 each of which has a plurality of stress applying grooves (inclined grooves 13) extending in parallel with the first direction and second regions 15 each of which has a plurality of stress applying grooves (parallel grooves 14) extending in the direction different from the first direction. Therefore, the extending direction of the optical active polymer also includes the case where the angle θ1 (refer to FIG. 2) intersecting with the long sides 1*a* and 1*a* of the piezoelectric sensor 1 is other angles than 45 degrees. As a result, a case where the piezoelectric sensor 1 is bent such that the opposing corners approach each other can also be detected, thereby increasing a range that can detect the bending of the piezoelectric sensor 1.

Second Embodiment

Figure 6:
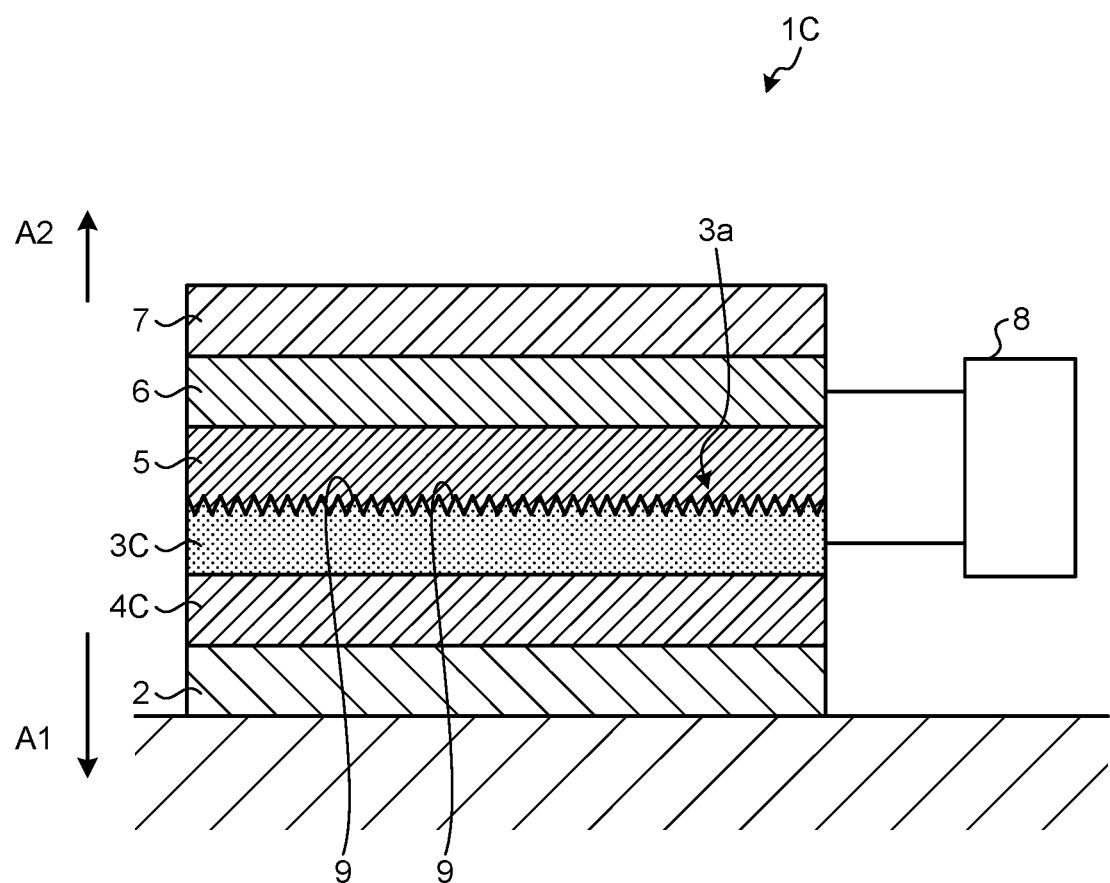
FIG. 6 is a cross-sectional view illustrating a cross-sectional structure of a piezoelectric sensor according to a second embodiment.
Figure 7:
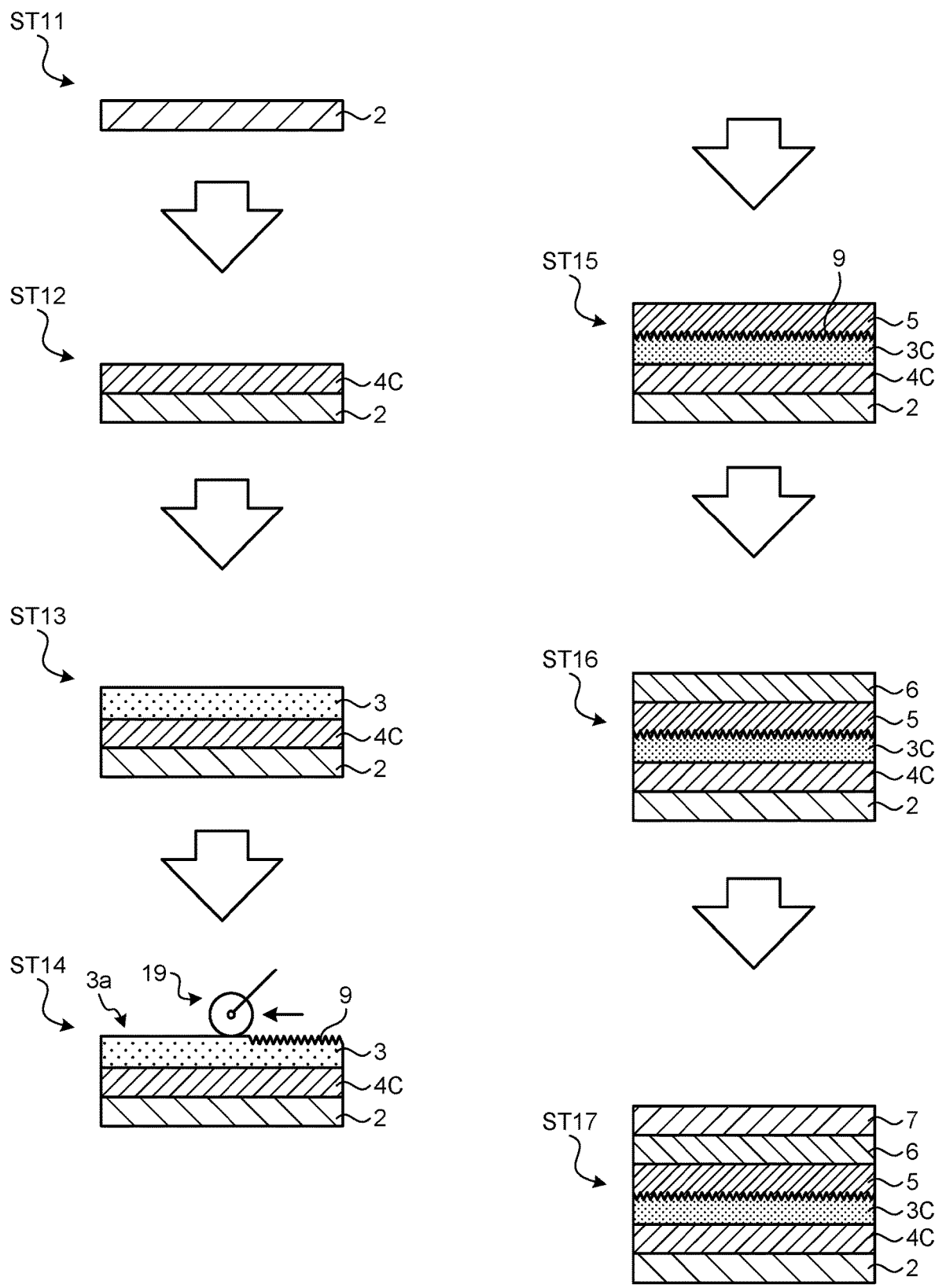
FIG. 7 is an explanatory view for explaining an example of the manufacturing method of the piezoelectric sensor according to the second embodiment.

FIG. 6 is a cross-sectional view illustrating a cross-sectional structure of a piezoelectric sensor according to a second embodiment. FIG. 7 is an explanatory view for explaining an example of the manufacturing method of the piezoelectric sensor according to the second embodiment. This piezoelectric sensor 1C according to the second embodiment includes the substrate 2, a first electrode layer 4C, a template layer 3C, the piezoelectric layer 5, the second electrode layer 6, and the protection layer 7. The piezoelectric sensor 1C according to the second embodiment differs from the piezoelectric sensor 1 in the first embodiment in that the layering order of the first electrode layer 4C and the template layer 3C is reversed from that in the piezoelectric sensor 1. The following describes the first electrode layer 4C and the template layer 3C in detail.

The first electrode layer 4C is flattened. The second surface 3*a* of the template layer 3C is subjected to the rubbing processing and the primary grooves 9 are formed on the second surface 3*a*. The piezoelectric layer 5 is formed on the second surface 3*a* of the template layer 3C. Therefore, the optical active polymer contained in the polymer piezoelectric material extends along the primary grooves 9. That is, in the second embodiment, the primary grooves 9 are the stress applying grooves.

As illustrated in FIG. 7, the manufacturing method of the piezoelectric sensor 1C includes the preparation process that prepares the substrate 2 (ST11), the first electrode layer forming process that forms the first electrode layer 4C on the substrate 2 (ST12), the template layer forming process that forms the template layer 3C on the first electrode layer 4C (ST13), the primary groove forming process that forms the primary grooves 9 on the second surface 3*a* of the template layer 3 by the rubbing processing (ST14), the piezoelectric layer forming process that forms the piezoelectric layer 5 on the template layer 3C (ST15), the second electrode layer forming process that forms the second electrode layer 6 on the piezoelectric layer 5 (ST16), and the protection layer forming process that forms the protection layer 7 (ST17). As described above, since the first electrode layer 4C is formed prior to the formation of the template layer 3C, the secondary grooves 10 are not formed on the first electrode layer 4C and the first electrode layer 4C has a flat plate like shape. In the primary groove forming process (ST14), the primary grooves 9 formed on the template layer 3C are the stress applying grooves that cause the optical active polymer to extend. That is, in the first embodiment, the primary grooves 9 are formed followed by the formation of the secondary grooves 10, and the secondary grooves 10 cause the optical active polymer to extend. In the second embodiment, the primary grooves 9 directly cause the optical active polymer to extend. The grooves and depths of primary grooves 9 in the second embodiment differ from those of the primary grooves 9 in the first embodiment.

As described above, the piezoelectric sensor 1C in the second embodiment includes, as an underlayer of the piezoelectric layer 5, the template layer (stress applying layer) 3C having the stress applying grooves (primary grooves 9), and causes the optical active polymer to extend to exhibit power generation property. Therefore, the piezoelectric layer 5 having a large area can be easily manufactured. The work for attaching the piezoelectric layer (piezoelectric sheet) 5 is not required, thereby increasing production efficiency of the piezoelectric sensor 1.

Third Embodiment

Figure 8:
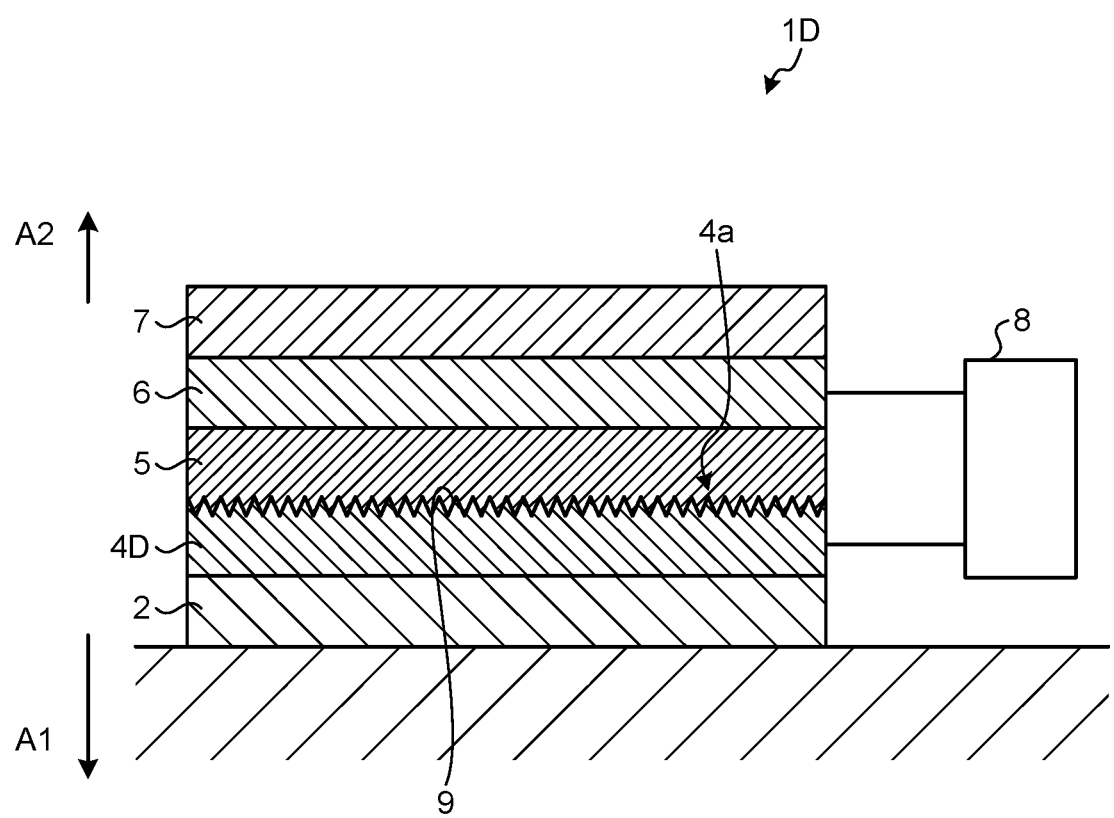
FIG. 8 is a cross-sectional view illustrating a cross-sectional structure of a piezoelectric sensor according to a third embodiment.
Figure 9:
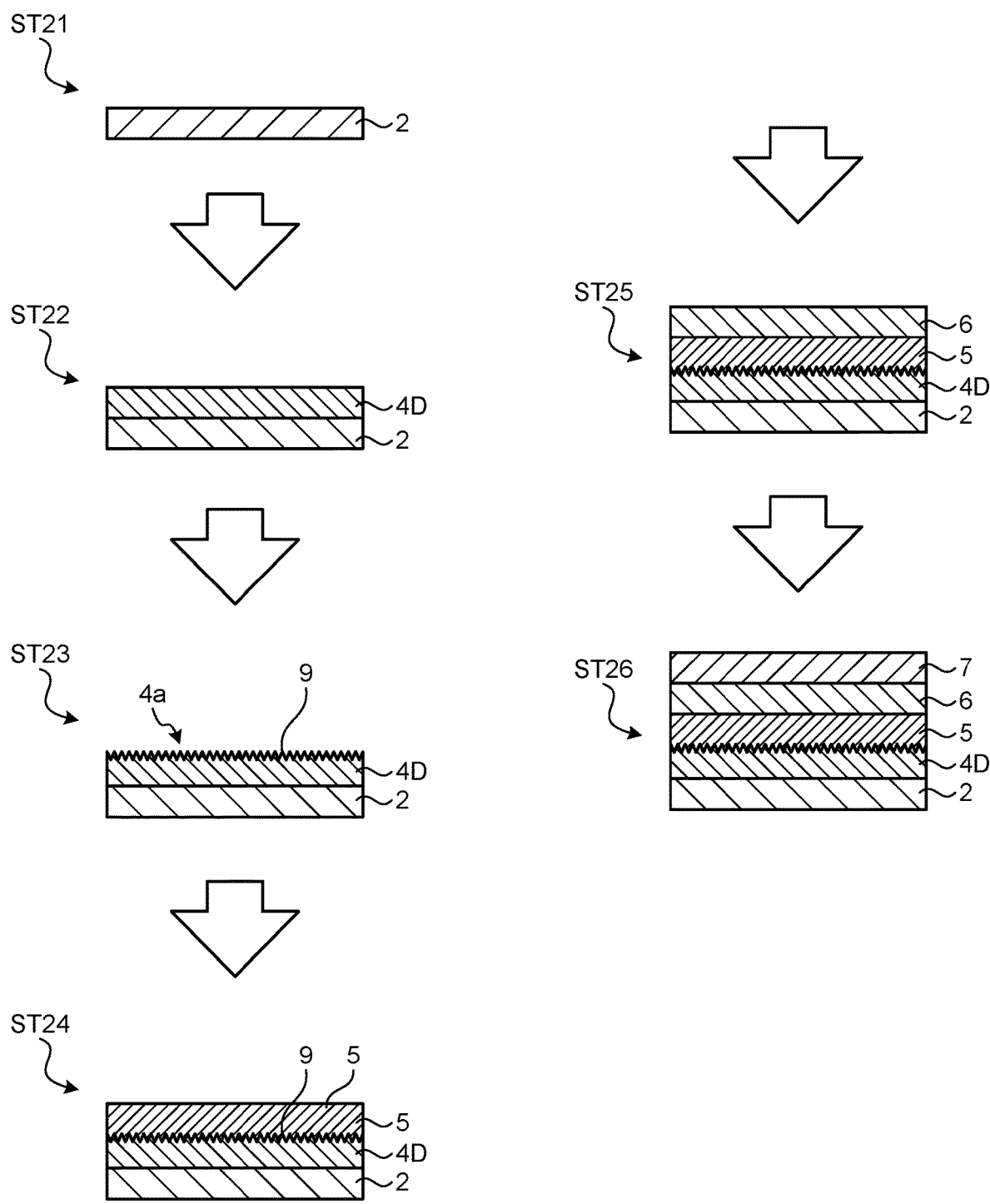
FIG. 9 is an explanatory view for explaining an example of the manufacturing method of the piezoelectric sensor according to the third embodiment.

FIG. 8 is a cross-sectional view illustrating a cross-sectional structure of a piezoelectric sensor according to a third embodiment. FIG. 9 is an explanatory view for explaining an example of the manufacturing method of the piezoelectric sensor according to the third embodiment. This piezoelectric sensor 1D according to the third embodiment includes the substrate 2, a first electrode layer 4D, the piezoelectric layer 5, the second electrode layer 6, and the protection layer 7. Therefore, the piezoelectric sensor 1D according to the third embodiment differs from the piezoelectric sensor 1 in the first embodiment in that the piezoelectric sensor 1D does not include the template layer 3.

The first electrode layer 4D is formed on the substrate 2. The primary grooves 9 are formed on the second surface 4*a* of the first electrode layer 4D. The piezoelectric layer 5 is formed on the second surface 4*a* of the first electrode layer 4D. Therefore, primary grooves 9 on the first electrode layer 4D cause the optical active polymer contained in the polymer piezoelectric material to extend. That is, in the third embodiment, the primary grooves 9 are the stress applying grooves.

As illustrated in FIG. 9, the manufacturing method of the piezoelectric sensor 1D includes the preparation process that prepares the substrate 2 (ST21), the first electrode layer forming process that forms the first electrode layer 4D on the substrate 2 (ST22), the primary groove forming process that forms the primary grooves 9 on the second surface 4*a* of the first electrode layer 4D (ST23), the piezoelectric layer forming process that forms the piezoelectric layer 5 on the first electrode layer 4 (ST24), the second electrode layer forming process that forms the second electrode layer 6 on the piezoelectric layer 5 (ST25), and the protection layer forming process that forms the protection layer 7 (ST26). In the primary groove forming process (ST23), the primary grooves 9 are formed by irradiating the second surface 4*a* of the first electrode layer 4D with laser (not illustrated). The width and depth of each primary groove 9 are appropriately adjusted such that the primary grooves 9 cause the optical active polymer to extend.

As described above, the piezoelectric sensor 1D in the third embodiment includes, as an underlayer of the piezoelectric layer 5, the first electrode layer (stress applying layer) 4D having the stress applying grooves (primary grooves 9), and causes the optical active polymer to extend to exhibit power generation property. Therefore, the piezoelectric layer 5 having a large area can be easily manufactured. The work for attaching the piezoelectric layer (piezoelectric sheet) 5 is not required, thereby increasing the production efficiency of the piezoelectric sensor 1.

Fourth Embodiment

Figure 10:
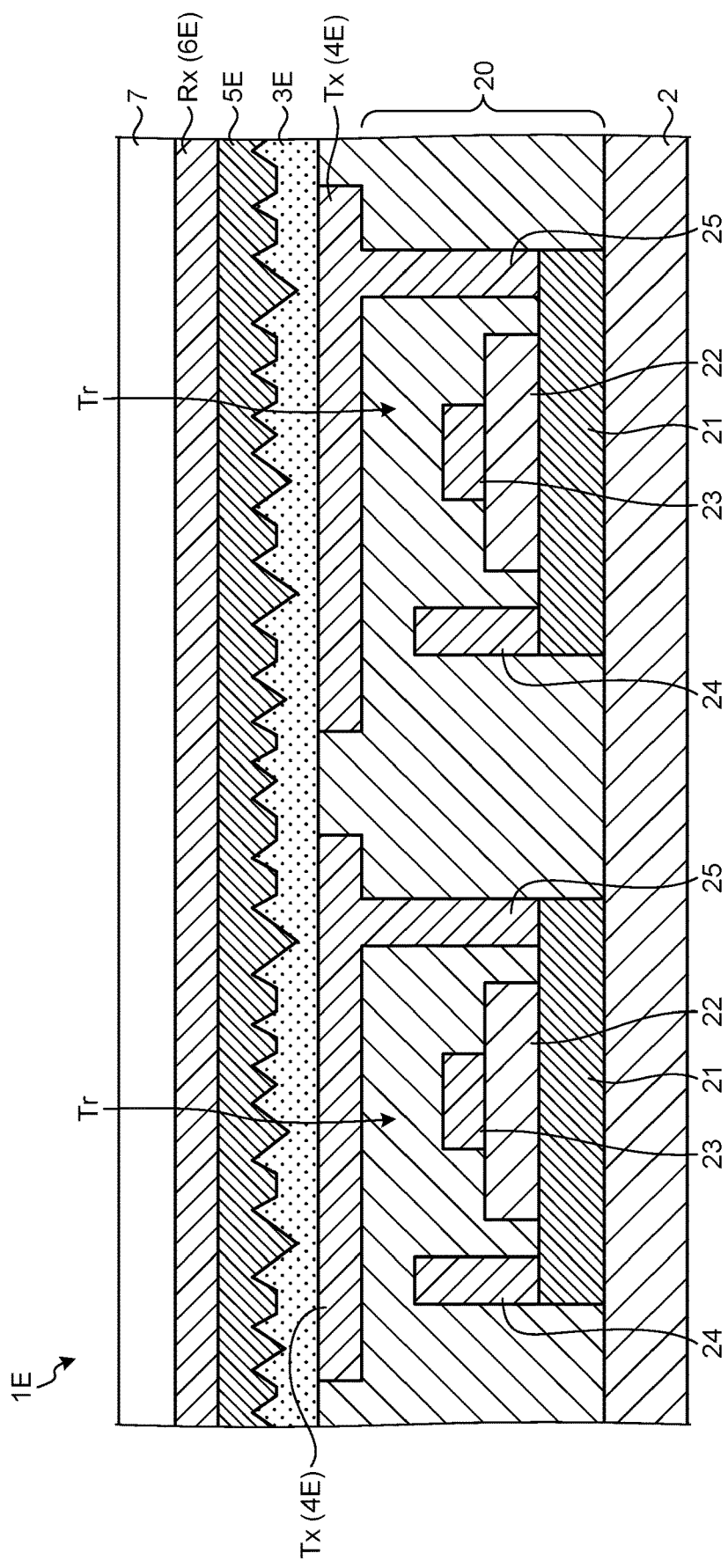
FIG. 10 is a cross-sectional view illustrating a cross-sectional structure of a piezoelectric sensor according to a fourth embodiment.
Figure 11:
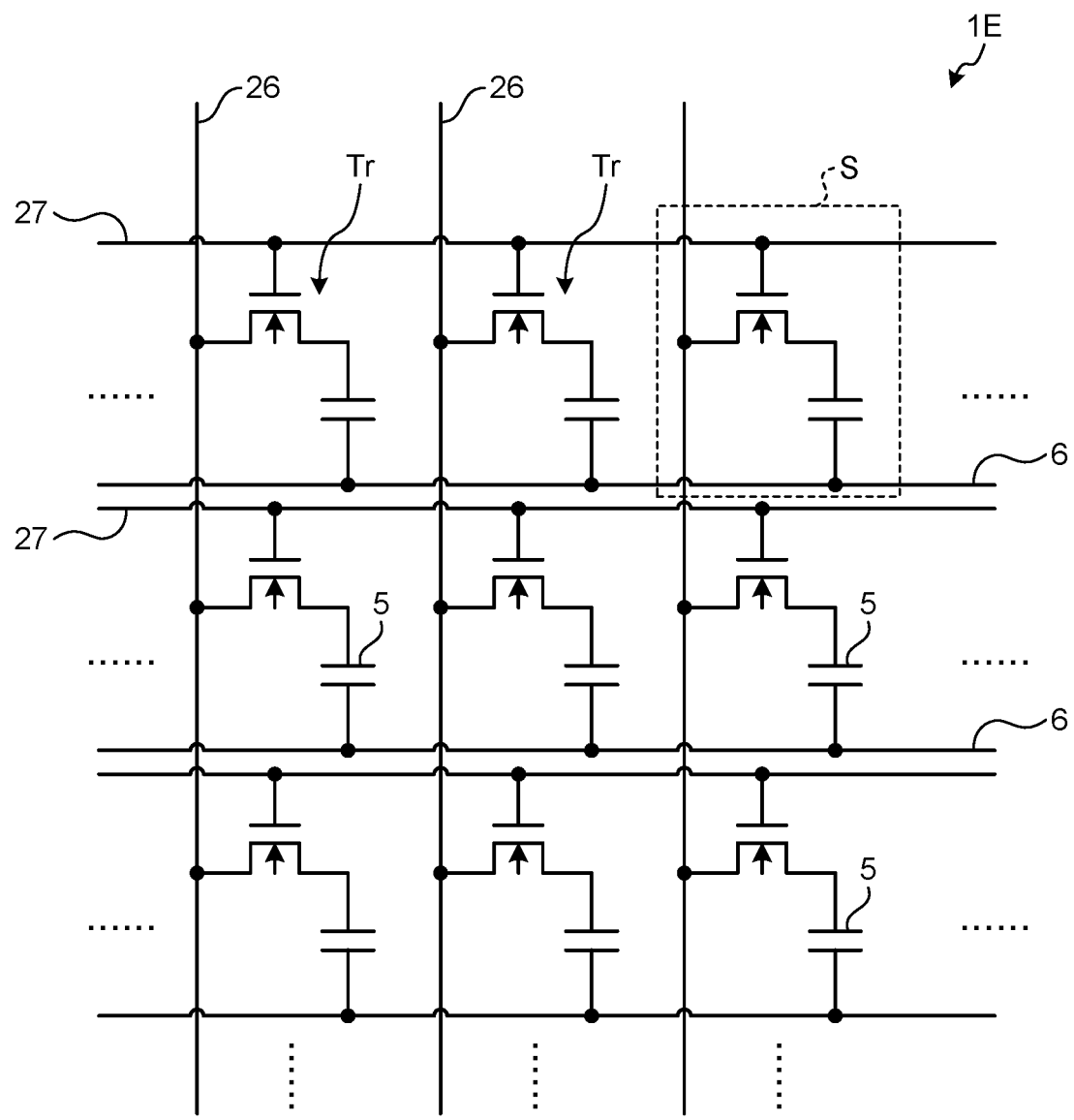
FIG. 11 is a circuit diagram for explaining a circuit structure in the fourth embodiment.

FIG. 10 is a cross-sectional view illustrating a cross-sectional structure of a piezoelectric sensor according to a fourth embodiment. FIG. 11 is a circuit diagram for explaining a circuit structure in the fourth embodiment. As illustrated in FIGS. 10 and 11, a piezoelectric sensor 1E is an active matrix type sensor. The piezoelectric sensor 1E includes the substrate 2, a semiconductor layer 20 formed on the substrate 2, a plurality of drive electrodes Tx (a first electrode layer 4E) formed on the semiconductor layer 20, a template layer 3E formed on the drive electrodes Tx, a piezoelectric layer 5E formed on the template layer 3E, a plurality of detection electrodes Rx (a second electrode layer 6E) formed on the piezoelectric layer 5E, and the protection layer 7.

The semiconductor layer 20 is provided with transistors Tr serving as switching elements. The transistor Tr is of a top gate type in which a semiconductor 21, an insulation film 22, and a gate electrode 23 are layered in this order. As illustrated in FIG. 11, in the semiconductor layer 20, signal lines 26 that supply signals from the controller 8 (refer to FIG. 1) and scanning lines 27 that drive the transistors Tr are layered. The scanning line 27 acts as a gate of the transistor Tr. The signal line 26 supplies the signal to a drain electrode 24 of the transistor Tr. A source electrode 25 of the transistor Tr is coupled to the drive electrode Tx (first electrode layer 4).

As described above, according to the fourth embodiment, it can detect whether the piezoelectric layer 5 is bent for each crossing region S (refer to broken line S in FIG. 11) in which the drive electrode Tx (first electrode layer 4E) and the detection electrode Rx (second electrode layer 6E) intersect.

Third Modification

Figure 12:
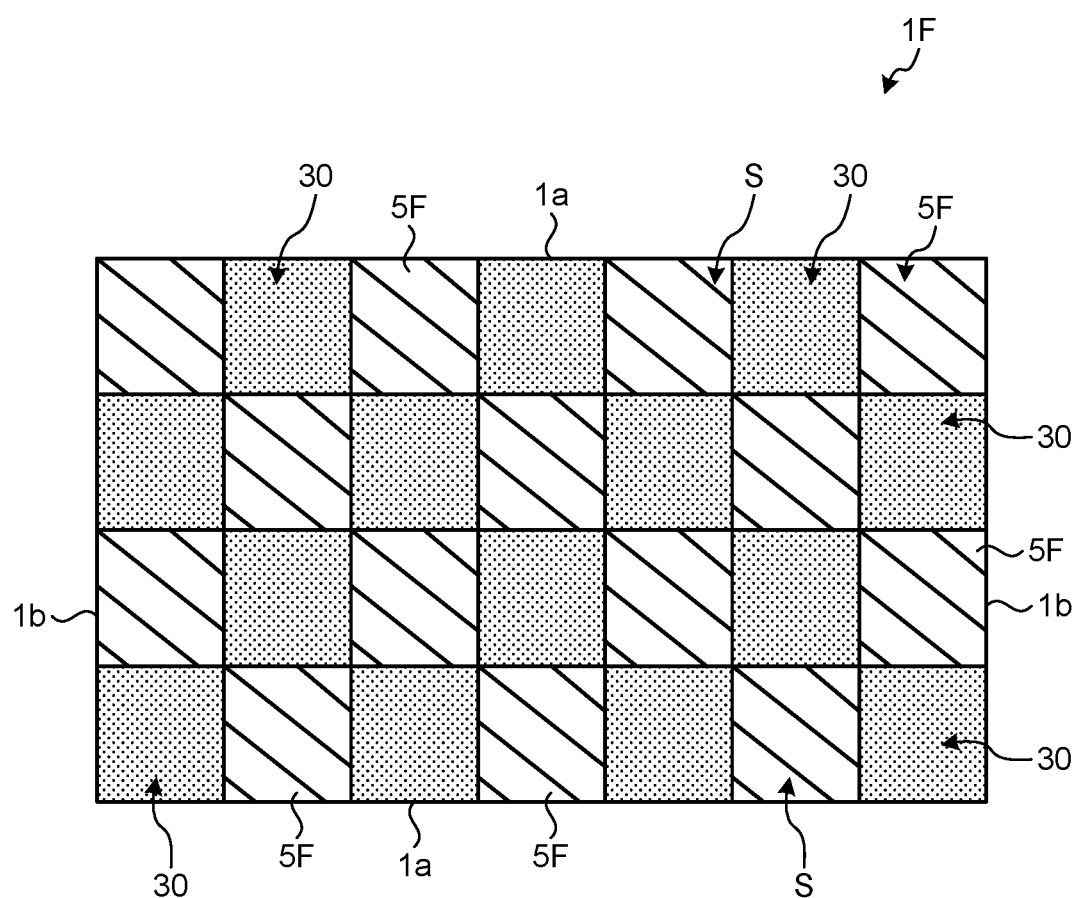
FIG. 12 is a cross-sectional view of piezoelectric layers of a piezoelectric sensor in a fourth modification.

FIG. 12 is a cross-sectional view of piezoelectric layers of a piezoelectric sensor in a fourth modification. This piezoelectric sensor 1F according to the fourth modification differs from the piezoelectric sensor 1E according to the fourth embodiment in that piezoelectric layers 5F are not formed on the whole surface. The following describes the details.

As illustrated in FIG. 12, the piezoelectric layers 5F are each formed in a rectangular shape when viewed from the layering direction. The piezoelectric layers 5F are divided into a plurality of regions that are apart from each other. Specifically, the regions in which the piezoelectric layers 5F are formed are provided at intervals in a long side direction in which the long side 1a of the piezoelectric sensor 1 extends and a short side direction in which the short side 1b of the piezoelectric sensor 1 extends. The drive electrode Tx (first electrode layer 4E) and the detection electrode Rx (second electrode layer 6E) intersect at a position where the piezoelectric layer 5F is provided (refer to arrow S in FIG. 12). As a result, quadrilateral shaped blank regions 30 provided with no piezoelectric layer 5F are formed between the piezoelectric layers 5F.

As described above, the piezoelectric sensor 1 according to the third modification has the blank regions 30. The blank regions 30 can be provided with sensor materials different from that of the piezoelectric layers 5F. Examples of the different sensor materials include ones that measure temperatures and ones that detect light. Concrete examples of the materials measuring temperatures include polymers dispersed with conductive fine particles or carbon nanotube, and poly (3,4-ethylenedioxythiophene): polystyrene sulfonic acid. Examples of the materials detecting light include materials used for organic solar cells and perovskite solar cells, for example, P3HT/C60. Alternatively, it may be an organic photoconductor, the resistance value of which is decreased by being irradiated with light, such as phthalocyanine.

What is claimed is:

1. A piezoelectric sensor, comprising:
   a stress applying layer in which a plurality of stress applying grooves extending in parallel with a first direction are formed in a predetermined region on a whole surface;
   a piezoelectric layer that is layered on the stress applying layer and formed from a polymer piezoelectric material containing an optical active polymer; and
   a template layer that is disposed opposite the piezoelectric layer in relation to the stress applying layer,
   wherein
   the stress applying layer is an electrode layer,
   the template layer has a primary groove formed on the template layers,
   the electrode layer has a secondary groove that is recessed corresponding to the primary groove and formed on the electrode layer,
   the secondary groove is in contact with the piezoelectric layer,
   the template layer has a plurality of regions each being formed in a rectangular shape in plan view, and
   the first direction is inclined at an angle of 45 degrees with respect to each side of the regions.

2. The piezoelectric sensor according to claim 1, wherein the piezoelectric layer has the regions that are apart from each other.

3. A piezoelectric sensor, comprising:
   a template layer in which a plurality of stress applying grooves extending in parallel with a first direction are formed in a predetermined region on a whole surface;
   a piezoelectric layer that is layered on the template layer and formed from a pollymer piezoelectric material containing an optical active polymer; and
   an electrode layer that is disposed opposite the piezoelectric layer in relation to the template layer, wherein
   the template layer has a primary groove that extends in parallel with the first direction and is formed on the template layer,
   the template layer has a plurality of regions each being formed in a rectangular shape in plan view, and
   the first direction is included at an angle of 45 degrees with respect to each side of the regions.

4. The piezoelectric sensor according to claim 3, wherein the piezoelectric layer has the regions that are apart from each other.

5. A piezoelectric sensor, comprising:
   a stress applying layer in which a plurality of stress applying grooves extending in parallel with a first direction are formed in a predetermined region on a whole surface; a piezoelectric layer that is layered on the stress applying layer and formed from
   a polymer piezoelectric material containing an optical active polymer; and
   a template layer that is disposed opposite the piezoelectric layer in relation to the stress applying layer,
   wherein
   the stress applying layer is an electrode layer,
   the template layer has a primary groove formed on the template layer,
   the electrode layer has a secondary groove that is recessed corresponding to the primary groove and formed on the electrode layer, and
   the secondary groove is in contact with the piezoelectric layer, and
   the template layer has a plurality of regions each being formed in a rectangular shape in plan view, and the regions include a first region having a plurality of the primary grooves extending in parallel with the first direction and a second region having a plurality of the primary grooves extending in parallel with a direction different from the first direction.

6. The piezoelectric sensor according to claim 5, wherein the piezoelectric layer has the regions that are apart from each other.

7. A piezoelectric sensor, comprising:
a template layer in which a plurality of stress applying grooves extending in parallel with a first direction are formed in a predetermined region on a whole surface;
a piezoelectric layer that is layered on the template layer and formed from a polymer piezoelectric material containing an optical active polymer; and
an electrode layer that is disposed opposite the piezoelectric layer in relation to the template layer, wherein
the template layer has a primary groove that extends in parallel with the first direction and is formed on the template layer, and
the template layer has a plurality of regions each being formed in a rectangular shape in plan view, and the regions include a first region having a plurality of primary grooves extending in parallel with the first direction and a second region having a plurality of the primary grooves extending in parallel with a direction different from the first direction.

8. The piezoelectric sensor according to claim 7, wherein the piezoelectric layer has the regions that are apart from each other.

* * * * *